United States Patent
Pichumani

(10) Patent No.: US 12,526,925 B1
(45) Date of Patent: Jan. 13, 2026

(54) INTEGRATED CIRCUIT INTERCONNECTS WITH INTEGRATED IN-LINE CAPACITORS

(71) Applicant: Meta Platforms, Inc., Menlo Park, CA (US)

(72) Inventor: Pradip Sairam Pichumani, Bellevue, WA (US)

(73) Assignee: Meta Platforms, Inc., Menlo Park, CA (US)

(*) Notice: Subject to any disclaimer, the term of this patent is extended or adjusted under 35 U.S.C. 154(b) by 751 days.

(21) Appl. No.: 17/847,631

(22) Filed: Jun. 23, 2022

(51) Int. Cl.
| | |
|---|---|
| H05K 1/18 | (2006.01) |
| H01L 23/522 | (2006.01) |
| H05K 1/11 | (2006.01) |
| H05K 3/30 | (2006.01) |
| H05K 3/34 | (2006.01) |
| H05K 3/40 | (2006.01) |

(52) U.S. Cl.
CPC ......... *H05K 1/181* (2013.01); *H01L 23/5223* (2013.01); *H05K 1/111* (2013.01); *H05K 3/303* (2013.01); *H05K 3/3452* (2013.01); *H05K 3/4007* (2013.01); *H05K 2201/09281* (2013.01); *H05K 2201/10015* (2013.01); *H05K 2201/10492* (2013.01); *H05K 2203/0415* (2013.01)

(58) Field of Classification Search
CPC ........ H05K 1/181; H05K 1/111; H05K 3/303; H05K 3/3452; H05K 3/4007; H05K 2201/09281; H05K 2201/10015; H05K 2201/10492; H05K 2203/0415; H01L 23/5223
See application file for complete search history.

(56) References Cited

U.S. PATENT DOCUMENTS

| | | | |
|---|---|---|---|
| 6,544,651 B2 | 4/2003 | Wong et al. | |
| 7,120,031 B2 | 10/2006 | Chakravorty et al. | |
| 7,349,223 B2 | 3/2008 | Haemer et al. | |
| 7,566,960 B1 * | 7/2009 | Conn | H01L 23/49822 |
| | | | 257/E23.079 |
| 8,238,074 B2 | 8/2012 | Steeneken | |
| 9,478,474 B2 | 10/2016 | Chen et al. | |
| 9,793,080 B2 | 10/2017 | Mori et al. | |
| 2015/0294791 A1 | 10/2015 | Hwang et al. | |
| 2020/0168535 A1 * | 5/2020 | Becker | H01L 23/642 |

* cited by examiner

*Primary Examiner* — Julia Slutsker
(74) *Attorney, Agent, or Firm* — EVERSHEDS SUTHERLAND (US) LLP

(57) ABSTRACT

A system that includes improved integrated circuit interconnects integrated with interconnect capacitors that reduce noise and improve signal quality is disclosed. The system comprises a first circuit board layer including a contact region of a conductor trace. The system further comprises a second layer including an interconnect capacitor, wherein the interconnect capacitor comprises a first side coupled over at least a portion of the contact region of the first circuit board layer to form a contact pad on a second side of the interconnect capacitor configured to interface with an integrated circuit chip.

8 Claims, 7 Drawing Sheets

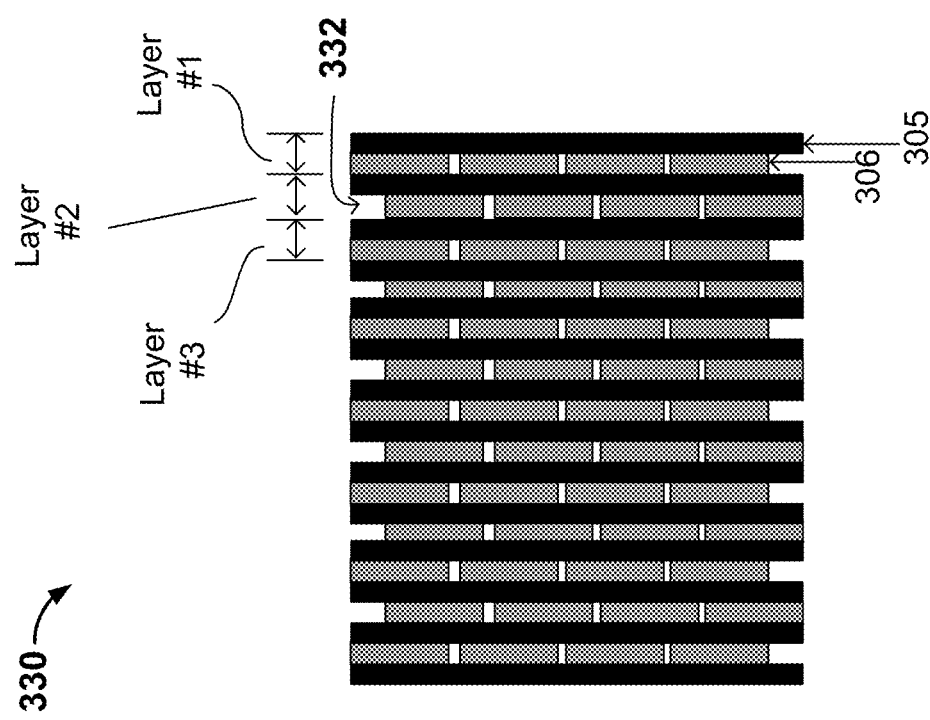

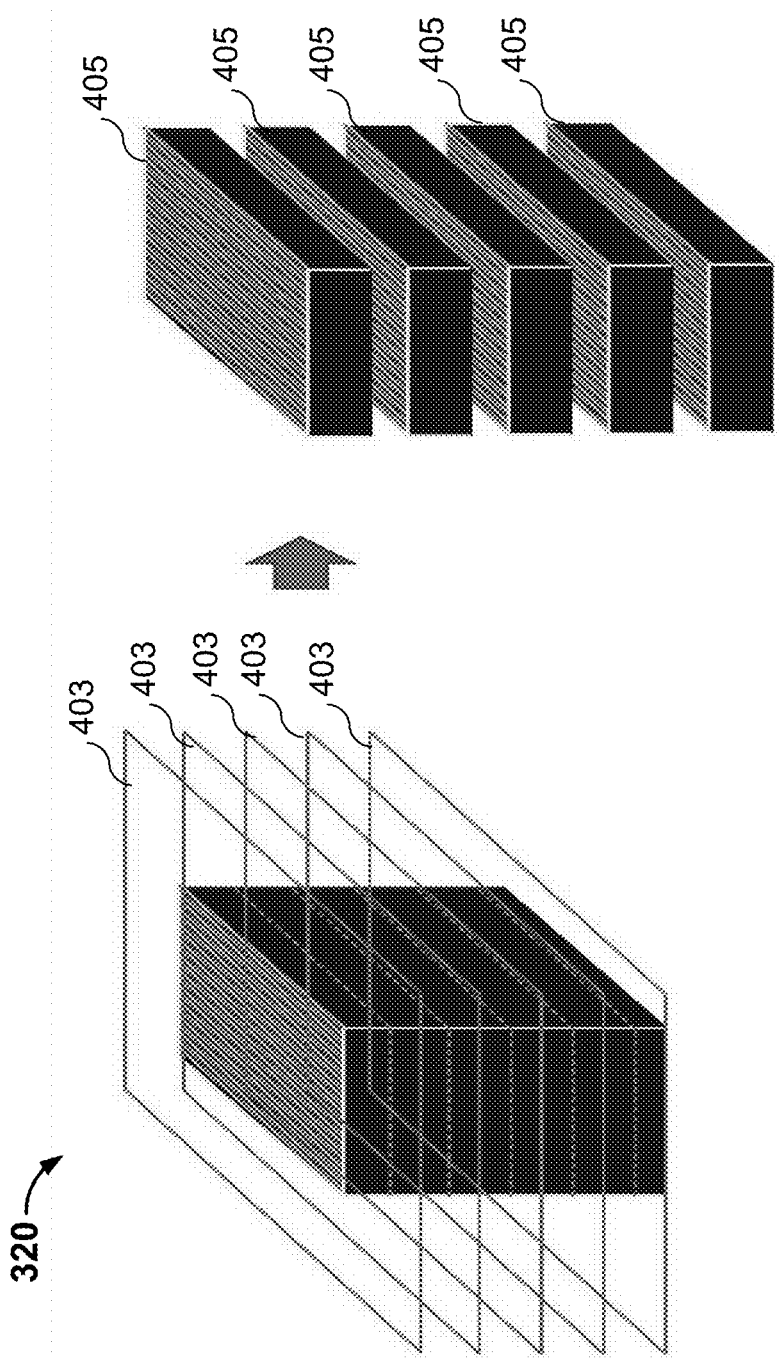

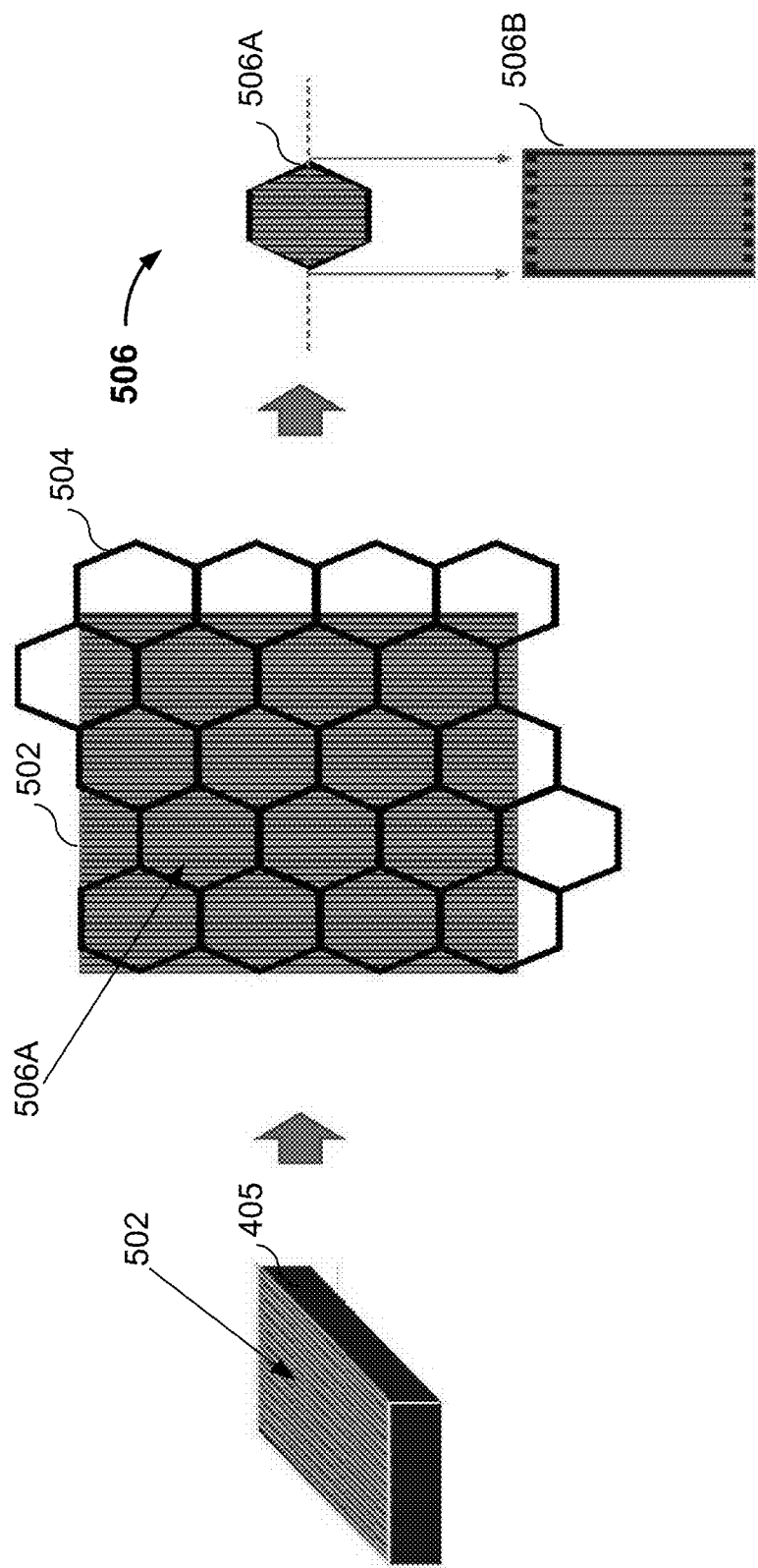

INTEGRATED CIRCUIT INTERCONNECTS WITH INTEGRATED IN-LINE CAPACITORS

BACKGROUND OF THE INVENTION

Electrical circuits (e.g., integrated circuits) may include both active and passive components. An active component is an electronic component that supplies energy to a circuit. Examples include voltage sources, current sources, and transistors. A passive component is an electronic component that can only receive energy. Examples include resistors, inductors, capacitors, and transformers. Capacitors are one of the most common surface-mount devices (SMDs) that are mounted directly onto the surfaces of printed circuit boards (PCBs).

Capacitors have many applications in an electrical circuit. For example, coupling capacitors are used as DC (direct current) blockers. Decoupling capacitors are used for the removal of AC (alternating current) signals from power rails. Hold-up capacitors may be used to provide power when needed. Capacitors may also be used for the smoothening of the output power supply. They may also be used in frequency tuners in resonant circuits and electrostatic discharge (ESD) protection circuits.

Integrated circuits (ICs) have fast switching transistors, which generate radio frequency (RF) signals. Electrical signals travel in loops around power supply pins. Therefore, capacitors (e.g., multilayer ceramic capacitors (MLCCs)) should be mounted as close to the device as possible to increase the effectiveness of the decoupling. In addition, distance increases the parasitic inductance of the wires. Capacitors that are placed far from the ICs may cause polluted signals with unwanted spikes.

BRIEF DESCRIPTION OF THE DRAWINGS

Various embodiments of the invention are disclosed in the following detailed description and the accompanying drawings.

FIG. 3C illustrates a cross-sectional view 330 of a portion of the multi-layered comb stack 320.

FIG. 4A illustrates that the multi-layered comb stack 320 in FIG. 3B may be further partitioned by cutting the multi-layered comb stack 320 by a dicing process based on a plurality of parallel cutting planes 403.

FIG. 4B illustrates that the multi-layered comb stack 320 is cut into the plurality of planks 405.

FIG. 5A illustrates a plank 405 that is cut from the multi-layered comb stack 320.

FIG. 5B illustrates a top view of plank 405.

FIG. 5C illustrates an individual interconnect capacitor 506 with a top view 506A and a cross-sectional view 506B.

DETAILED DESCRIPTION

Figure 1:
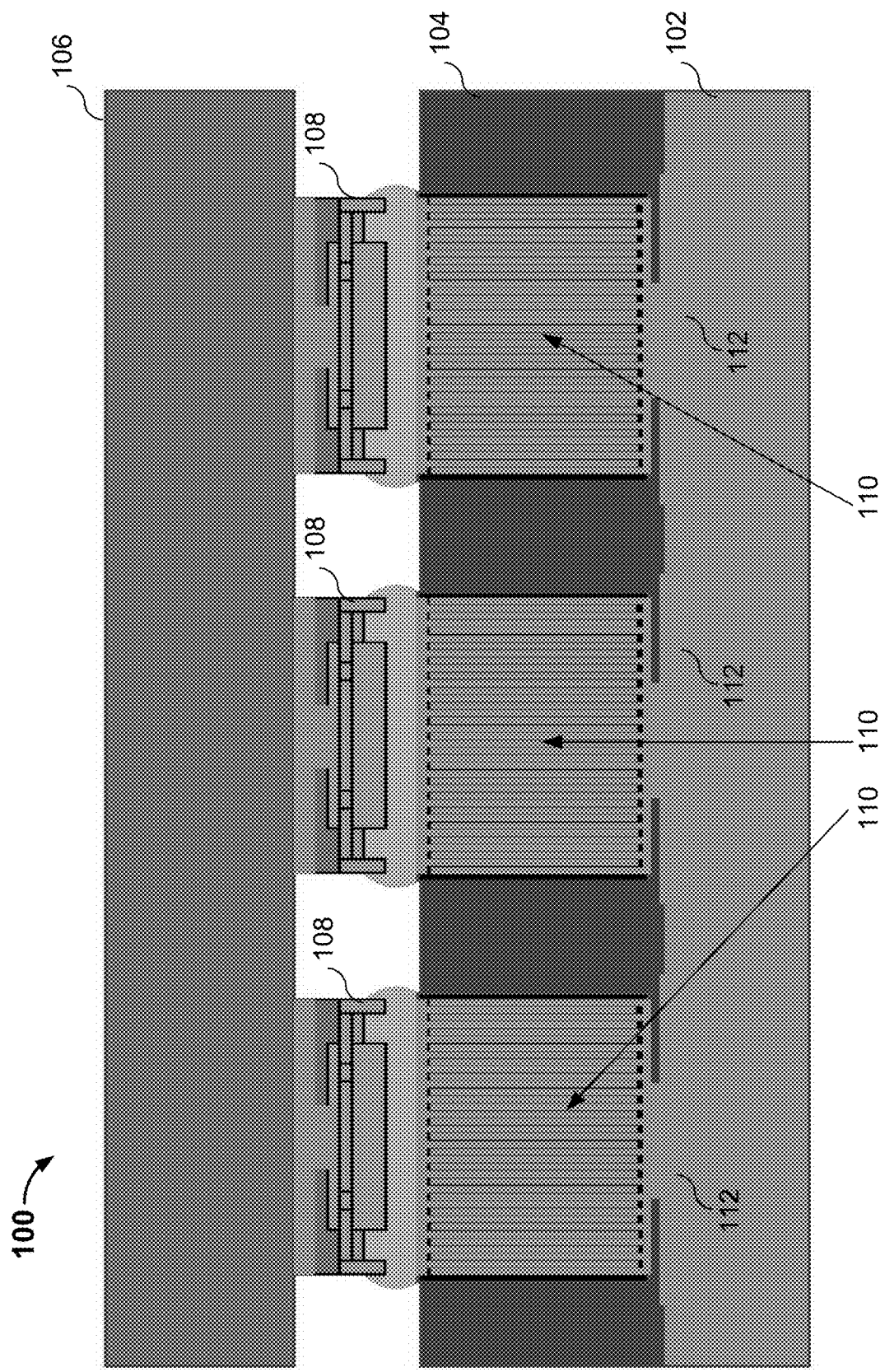
FIG. 1 illustrates an exemplary system 100 with improved integrated circuit interconnects integrated with interconnect capacitors that reduce noise and improve signal quality.

The disclosure can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the disclosure may take, may be referred to as techniques. In general, the order of the steps of disclosed processes may be altered within the scope of the disclosure. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the disclosure is provided below along with accompanying figures that illustrate the principles of the disclosure. The disclosure is described in connection with such embodiments, but the disclosure is not limited to any embodiment. The scope of the disclosure is limited only by the claims and the disclosure encompasses numerous alternatives, modifications, and equivalents. Numerous specific details are set forth in the following description in order to provide a thorough understanding of the disclosure. These details are provided for the purpose of example and the disclosure may be practiced according to the claims without some or all of these specific details. For the purpose of clarity, technical material that is known in the technical fields related to the disclosure has not been described in detail so that the disclosure is not unnecessarily obscured.

In the present application, a system that includes improved integrated circuit interconnects integrated with interconnect capacitors that reduce noise and improve signal quality is disclosed. The system comprises a first circuit board layer including a contact region of a conductor trace. The system further comprises a second layer including an interconnect capacitor, wherein the interconnect capacitor comprises a first side coupled over at least a portion of the contact region of the circuit board layer to form a contact pad on a second side of the interconnect capacitor configured to interface with an integrated circuit chip.

A method of providing a system with improved integrated circuit interconnects integrated with interconnect capacitors that reduce noise and improve signal quality is disclosed. A first circuit board layer including a contact region of a conductor trace is provided. A second layer including an interconnect capacitor is provided, wherein the interconnect capacitor comprises a first side coupled over at least a portion of the contact region of the first circuit board layer to form a contact pad on a second side of the interconnect capacitor configured to interface with an integrated circuit chip.

A method of providing an improved interconnect capacitor is disclosed. A plurality of dielectric sheets is provided. Electrodes are deposited on the plurality of dielectric sheets to form a plurality of planar layers, wherein a planar layer comprises a dielectric sheet with a plurality of stripes of electrodes deposited on top of the dielectric sheet. The plurality of planar layers is arranged substantially parallel to and overlapping with each other to form a stack. A plurality of interconnect capacitors is cut from the stack.

FIG. 1 illustrates an exemplary system 100 with improved integrated circuit interconnects integrated with interconnect capacitors that reduce noise and improve signal quality. System 100 includes a first circuit board layer including one or more contact regions of a conductor trace. As shown in FIG. 1, system 100 includes a package or circuit board 102 as a first layer. For example, circuit board 102 may be a printed circuit board (PCB). Circuit board 102 includes a network of conductor traces (not shown in FIG. 1). The network of conductor traces may be used to connect all the different components of the circuit board together and transmit signals and data from one point of the circuit board to another. The network of the conductor traces includes a plurality of contact regions 112 on the surface of circuit board 102 to provide electrical contacts to the conductor trace.

System 100 further includes a second layer 104. In some embodiments, the second layer 104 may be a solder mask layer or passivation layer. A solder mask is a protective coating over a circuit board that prevents oxidation and electrical shorts. A solder mask layer may be formed of a material (e.g., resin) that offers good resistance against humidity and temperature. A solder mask layer does not conduct electricity. The second layer 104 is coated over circuit board 102, except at certain portions of circuit board 102 where they are not covered by the second layer 104. The portions of circuit board 102 not covered by the second layer 104 expose the plurality of contact regions 112 on circuit board 102.

The second layer 104 includes a plurality of interconnect capacitors 110. For example, the interconnect capacitors 110 may be embedded in the second layer 104. An interconnect capacitor 110 comprises a first side coupled over at least a portion of a contact region of the circuit board layer to form a contact pad on a second side of the interconnect capacitor. As shown in FIG. 1, the bottom side of an interconnect capacitor 110 is coupled to a contact region 112 of circuit board 102. The bottom side of the interconnect capacitor 110 is over a contact region 112 of circuit board 102. The top side of the interconnect capacitor 110 forms a contact pad to provide an electrical contact. The top side of the interconnect capacitor 110 is configured to interface with a die or an integrated circuit chip 106 via a solder bump interface 108. The solder bump interface 108 is bonded to the top side of the interconnect capacitor 110. The solder bump interface 108 provides the contact between the top side of the interconnect capacitor 110 and the metal lines of the integrated circuit chip 106.

The interconnect capacitor 110 is integrated in-line with the solder bump interface 108. The interconnect capacitor 110 and the solder bump interface 108 are arranged substantially in a straight line (i.e., in-line) to form an improved integrated circuit interconnect that connects the integrated circuit chip 106 with circuit board 102.

Integrating the interconnect capacitor 110 in-line with the solder bump interface 108 to form the improved integrated circuit interconnect has many advantages. One advantage is that it minimizes the distance between the interconnect capacitor 110 and the active circuitries in the integrated circuit chip 106, thereby reducing noise and improving signal quality. Another advantage is that the integrated interconnect capacitor 110 is substantially in-line with the signal and power traces to enable a smaller form factor. The integrated interconnect capacitor 110 acts as an interconnect in the packaging process, thereby reducing the number of contacts and reducing the need to solder passive components to the circuit board. In addition, the trace length between the integrated circuit chip 106 and the interconnect capacitor 110 is reduced. The system allows different form factor designs depending on the do-not-populate (DNP) entries, simulation data, and the like. The underfilling process is optional in the system, and the improved integrated circuit interconnect may be used in the first, second, third, or $n^{th}$ level of packaging interconnection. The system is compatible with both legacy and advance technology nodes (e.g., 5 nm technology and beyond). The system is also compatible with existing packaging assembly processes. This system utilizes conductors of equal length to form the two polarities, thereby achieving the maximum capacitance for a parallel plate capacitor. The capacitance of a parallel plate capacitor is more than the calculated theoretical value due to the fringe effect.

The improved integrated circuit interconnects may be mixed and matched with the regular interconnects in a circuit board. In FIG. 1, each of the integrated circuit interconnects shown includes an integrated interconnect capacitor 110. However, it should be recognized that in some other embodiments, the system may include some regular interconnects without any integrated interconnect capacitors 110 and some interconnects with integrated interconnect capacitors 110. The regular interconnects connect the circuit board to the integrated circuit chip without any capacitors in between.

Figure 2:
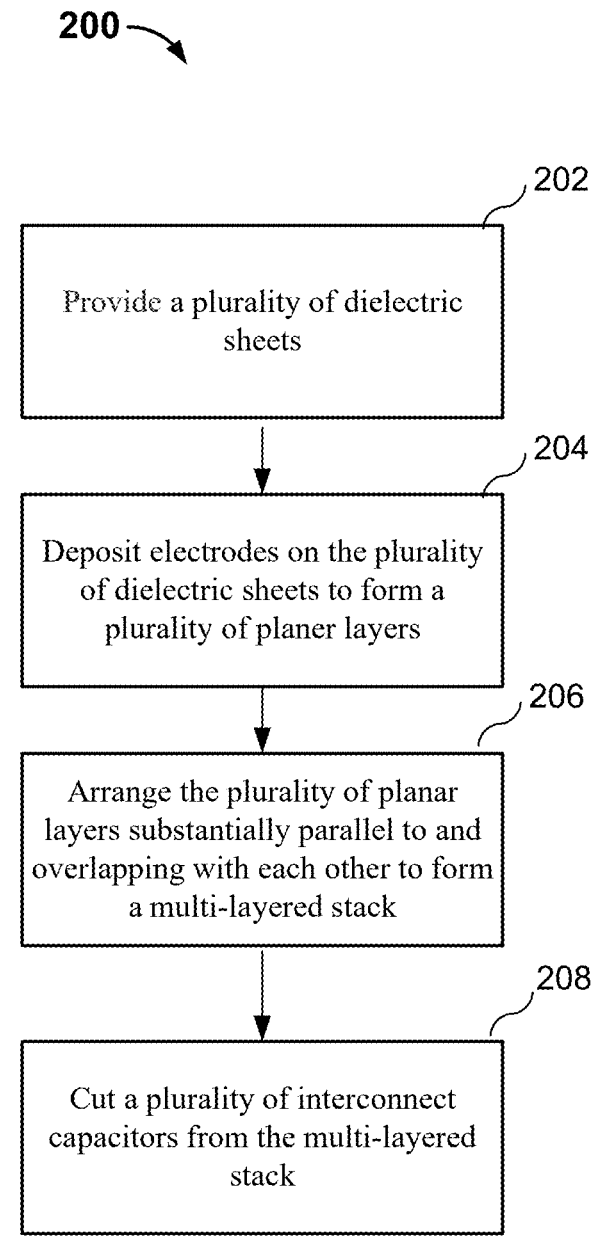
FIG. 2 illustrates an exemplary process 200 for providing an improved interconnect capacitor.

FIG. 2 illustrates an exemplary process 200 for providing an improved interconnect capacitor. At step 202, a plurality of dielectric sheets is provided. At step 204, electrodes are deposited on the plurality of dielectric sheets to form a plurality of planar layers. A planar layer comprises a dielectric sheet with a plurality of stripes of electrodes deposited on top of the dielectric sheet. At step 206, the plurality of planar layers is arranged substantially parallel to and overlapping with each other to form a multi-layered stack. At step 208, a plurality of interconnect capacitors is cut from the multi-layered stack.

Figure 3A:
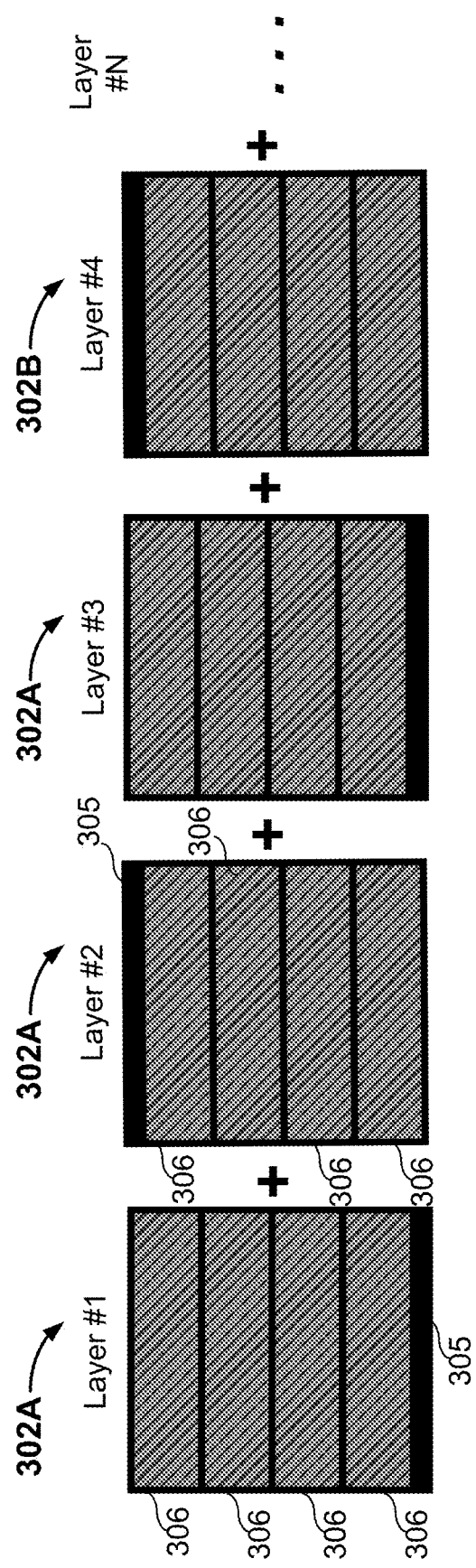
FIG. 3A illustrates a plurality of exemplary planar layers made of dielectrics and electrodes.

FIGS. 3A to 5C illustrate an exemplary number of intermediate stages of forming an interconnect capacitor and their corresponding intermediate products. FIG. 3A illustrates that a plurality of planar layers (302A and 302B) made of dielectrics and electrodes may be combined together to form a multi-layered comb stack 320 shown in FIG. 3B. FIG. 3C illustrates a cross-sectional view of a portion of the multi-layered comb stack 320. FIG. 4A illustrates that the multi-layered comb stack 320 in FIG. 3B may be further partitioned by cutting the multi-layered comb stack 320 by a dicing process based on a plurality of parallel cutting planes 403. FIG. 4B illustrates that the multi-layered comb stack 320 is cut into the plurality of planks 405. FIGS. 5A, 5B, and 5C further illustrate that a plank 405 that is cut from the multi-layered comb stack 320 may be further cut into an interconnect capacitor 506.

Figure 3B:
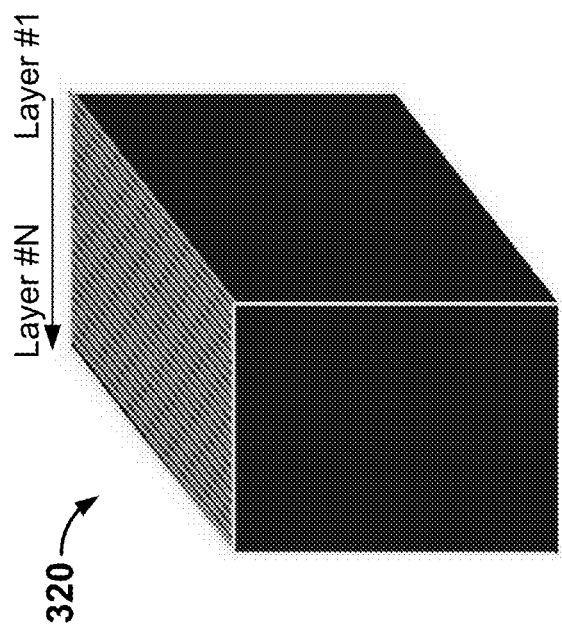
FIG. 3B illustrates an example of a multi-layered comb stack that is formed by combining the plurality of planar layers in FIG. 3A.

FIG. 3A illustrates a plurality of exemplary planar layers made of dielectrics and electrodes. FIG. 3B illustrates an example of a multi-layered comb stack that is formed by combining the plurality of planar layers in FIG. 3A. Referring to FIG. 3A, the planar layers (302A or 302B) are numbered from #1 to #N. A planar layer (302A or 302B) includes a dielectric sheet 305. The dielectric sheet 305 is formed of an insulating material. In some embodiments, a dielectric sheet 305 may be casted from a ceramic slurry. In some embodiments, a dielectric sheet 305 may be formed of a high-k dielectric material, a material with a high dielectric constant (K, kappa), as compared to silicon dioxide. Examples include zirconium dioxide, hafnium dioxide, and Barium titanate ($BaTiO_3$).

A plurality of electrodes 306 is then deposited onto the dielectric sheet 305. For example, the electrodes 306 may be printed electrodes that are printed onto the dielectric sheet 305. The electrodes 306 may be formed of any conductive material, such as silver or palladium on nickel. In some embodiments, multiple stripes of electrodes are printed onto the dielectric sheet 305 but leaving a portion of the dielectric sheet 305 on one edge of the dielectric sheet 305 exposed. For example, as shown in FIG. 3A, an odd-numbered planar layer 302A is oriented in such a way that the exposed dielectric portion is located on the bottom edge of the dielectric sheet 305, and an even-numbered planar layer 302B is oriented such that the exposed dielectric portion is located on the top edge of the dielectric sheet 305. The planar layers (302A and 302B) are then arranged parallel to and overlapping each other.

FIG. 3B illustrates an example of a multi-layered comb stack 320 that is formed by arranging the plurality of planar layers in FIG. 3A parallel to and overlapping each other. By alternating the orientation of the planar layers (302A and 302B) as described above and arranging them parallel to and overlapping each other (e.g., with layer #1 on the furthest right, and layer #2 to its left, and so on), the printed electrodes on one layer are slightly offset from the printed electrodes on the adjacent layer, thereby forming a multi-layered comb stack 320 with a comb-like structure.

FIG. 3C illustrates a cross-sectional view 330 of a portion of the multi-layered comb stack 320. Layer #1 is positioned on the furthest right; layer #2 is positioned parallel to and to the left of layer #1; and layer #3 is positioned parallel to and to the left of layer #2, and so on. Because of the slight offsets, the electrodes 306 on the odd-numbered planar layers are closer to one end of the multi-layered comb stack 320 (i.e., the top end) and the electrodes on the even-numbered planar layers are further away from that end of the stack and leaving a space 332 between two dielectric sheets 305. Similarly, the electrodes 306 on the even-numbered planar layers are closer to one end of the multi-layered comb stack 320 (i.e., the bottom end) and the electrodes on the odd-numbered planar layers are further away from that end of the stack and leaving a space between two dielectric sheets. As a result, comb-like features are located on the top end and the bottom end of the cross-sectional view 330. The comb-like features allow easier connection to the electrodes 306 of the odd-numbered planar layers 302A from the top. Similarly, the comb-like features allow easier connection to the electrodes of the even-numbered planar layers 302B from the bottom.

FIG. 4A illustrates that the multi-layered comb stack 320 in FIG. 3B may be further partitioned by cutting the multi-layered comb stack 320 by a dicing process based on a plurality of parallel cutting planes 403. FIG. 4B illustrates that the multi-layered comb stack 320 is cut into the plurality of planks 405. In some embodiments, the plurality of parallel cutting planes 403 are arranged such that the planks 405 have a size that is larger than a desired final plank size. In some embodiments, the size of the planks 405 is selected based on the estimated reduction in volume after the planks are cured. For example, the size of the planks 405 is selected such that it is larger than the desired final plank size by a predetermined percentage (e.g., 50%).

FIGS. 5A, 5B, and 5C further illustrate that a plank 405 that is cut from the multi-layered comb stack 320 may be further cut into an interconnect capacitor 506. FIG. 5A illustrates a plank 405 that is cut from the multi-layered comb stack 320. The plank 405 has a top surface 502. FIG. 5B illustrates a top view of plank 405. In some embodiments, a plank 405 may be cut into individual interconnect capacitors 506 using a top-down slicing process based on a slicing pattern 504. As shown in FIG. 5B, the slicing pattern 504 is formed of hexagonal shapes. However, the slicing pattern 504 may be formed of other shapes, including circular, rectangular, square, and the like. FIG. 5C illustrates an individual interconnect capacitor 506 with a top view 506A and a cross-sectional view 506B. The individual interconnect capacitor 506 has a cylindrical prism shape. As shown in the cross-sectional view 506B, the cross-sectional of interconnect capacitor 506 has multiple layers that are similar to the cross-sectional view 330 of the multi-layered comb stack 320. Each layer of the interconnect capacitor is a portion of a planar layer (e.g., 302A or 302B) made of dielectrics and electrodes. The top side and the bottom side of the interconnect capacitor 506 have comb-like features similar to those shown in FIG. 3C.

Once the interconnect capacitors 506 are cut into their final shape, the capacitors may be baked in an oven to cure the electrodes in place, which removes the moisture from the capacitors and reduces their volume by a percentage (e.g., 30-40%). In some embodiments, contacts may be added on either side of the capacitors by an electroplating process.

In some embodiments, the interconnect capacitors 506 are integrated with system 100 (shown in FIG. 1) using a pick-and-place (P&P) process. For example, robotic P&P machines may be used to place the interconnect capacitors 506 onto circuit board 102. In some embodiments, a second layer 104 is then coated to provide sidewall support to the placed interconnect capacitors 506. The second layer 104 may be a solder mask layer or passivation layer. In some embodiments, the second layer 104 may be printed onto the sheets and bonded to the system's top-most build-up layers. One terminal of the interconnect capacitor is thermosonically bonded to the system's build-up layer and the other terminal is connected with solder and bonded to the chip's back end of line (BEOL).

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
   a first circuit board layer including a contact region of a conductor trace; and
   a second layer including a first interconnect capacitor and a second interconnect capacitor, wherein the first interconnect capacitor and second interconnect capacitor both comprise a first side configured to interface with the the first circuit board layer, and a second side configured to interface with an integrated circuit chip,
   wherein the first interconnect capacitor and second interconnect capacitor are integrated in-line with a solder bump interface to form an integrated circuit interconnect that connects the integrated circuit chip with the first circuit board layer, wherein the first interconnect capacitor, second interconnect capacitor, and the solder bump interface are arranged substantially in a line and
   wherein the second layer is coated over the first circuit board layer and between the first interconnect capacitor and the second interconnect capacitor except at least the contact region of the conductor trace of the first circuit board layer.

2. The system of claim 1, wherein the first circuit board layer comprises a printed circuit.

3. The system of claim 1, wherein the second layer comprises a solder mask layer.

4. The system of claim 1, wherein the second layer comprises a passivation layer.

5. The system of claim 1, wherein the second side of the first interconnect capacitor and second interconnect capacitor are configured to interface with the integrated circuit chip via a solder bump interface.

6. The system of claim 1, wherein the first interconnect capacitor and second interconnect capacitor comprise a plurality of planar layers arranged substantially parallel to and overlapping each other, wherein a planar layer comprises a dielectric sheet and a plurality of electrodes on the dielectric sheet.

7. The system of claim 6, wherein the plurality of electrodes comprises a plurality of printed stripe electrodes printed onto the dielectric sheet.

8. The system of claim 1, wherein the first interconnect capacitor and second interconnect capacitor comprise a plurality of planar layers arranged substantially parallel to and overlapping each other, wherein a first planar layer comprises a first dielectric sheet and a first plurality of printed stripe electrodes on the first dielectric sheet, and wherein a second planar layer comprises a second dielectric sheet and a second plurality of printed stripe electrodes on the second dielectric sheet, and wherein a printed stripe pattern associated with the second plurality of printed stripe electrodes is offset from a printed stripe pattern associated with the first plurality of printed stripe electrodes.

* * * * *